United States Patent [19]

Maryanski et al.

[11] Patent Number: 5,321,357
[45] Date of Patent: Jun. 14, 1994

[54] THREE-DIMENSIONAL DETECTION, DOSIMETRY AND IMAGING OF AN ENERGY FIELD BY FORMATION OF A POLYMER IN A GEL

[75] Inventors: Marek Maryanski; John Gore; Robert Schulz, all of Guilford, Conn.

[73] Assignee: Yale University, New Haven, Conn.

[21] Appl. No.: 925,550

[22] Filed: Aug. 7, 1992

[51] Int. Cl.⁵ .............................................. G01V 3/00
[52] U.S. Cl. .................................................. 324/300
[58] Field of Search ..................... 342/300, 307, 309; 521/50.5; 522/1; 430/909, 910

[56] References Cited

U.S. PATENT DOCUMENTS

| | | | |
|---|---|---|---|
| 3,616,369 | 10/1971 | Williams | 204/159.22 |
| 4,350,607 | 9/1982 | Apfel | 252/408 |
| 4,430,258 | 2/1984 | McFarland et al. | 252/644 |
| 4,532,218 | 7/1985 | Strom | 436/82 |
| 4,537,667 | 8/1985 | Bishop et al. | 522/1 |
| 4,588,698 | 5/1986 | Gruner et al. | 436/533 |
| 4,613,758 | 9/1986 | Ing et al. | 250/474.1 |
| 4,779,000 | 10/1988 | Ing | 250/474.1 |
| 4,780,392 | 10/1988 | Walls et al. | 430/909 |
| 4,790,919 | 12/1988 | Baylor, Jr. | 204/182.8 |
| 4,946,705 | 8/1990 | Manning et al. | 427/2 |
| 4,994,347 | 2/1991 | Smothers | 430/910 |

Primary Examiner—Louis Arana
Attorney, Agent, or Firm—Millen, White, Zelano & Branigan

[57] ABSTRACT

A visible and/or MRI visualizable permanent image is formed in a gel in a container which maintains the gel a dimensionally stable shape, which gel contains uniformly dispersed therein in storage stable form at last one radiant energy, e.g., ionizing radiation, polymerizable monomer in a concentration effective to form an insoluble polymer in the gel which alters the relaxation time of the solvent in any area thereof in which the polymer is formed, e.g., a mixture of (a) a linearly homopolymerizable monomer and (b) a comonomer which is cross-linkably copolymerizable with the monomer, the polymerization of the monomer initiated by the radiant energy being restricted to any area of the gel which receives the radiant energy, which image is representative of the dose distribution of the radiant energy to which the gel is exposed, by exposing the gel to a non-uniform dose of radiant energy until a polymer which produces a permanent image representative of the dose of radiant energy received by the gel is formed therein.

16 Claims, 4 Drawing Sheets

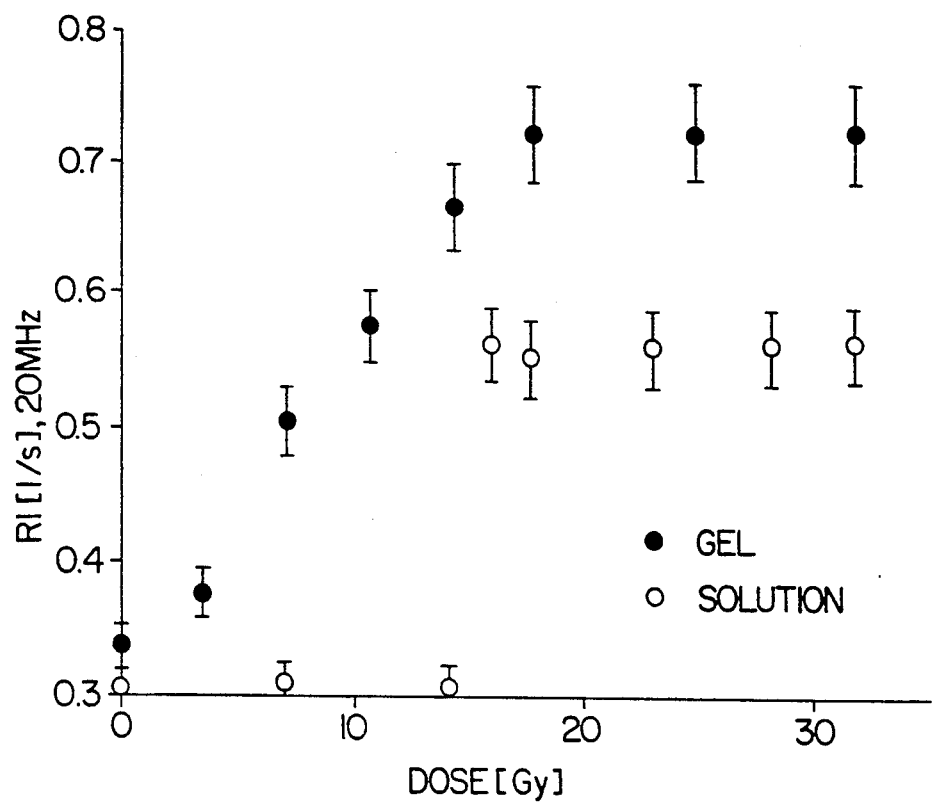
F I G. 1

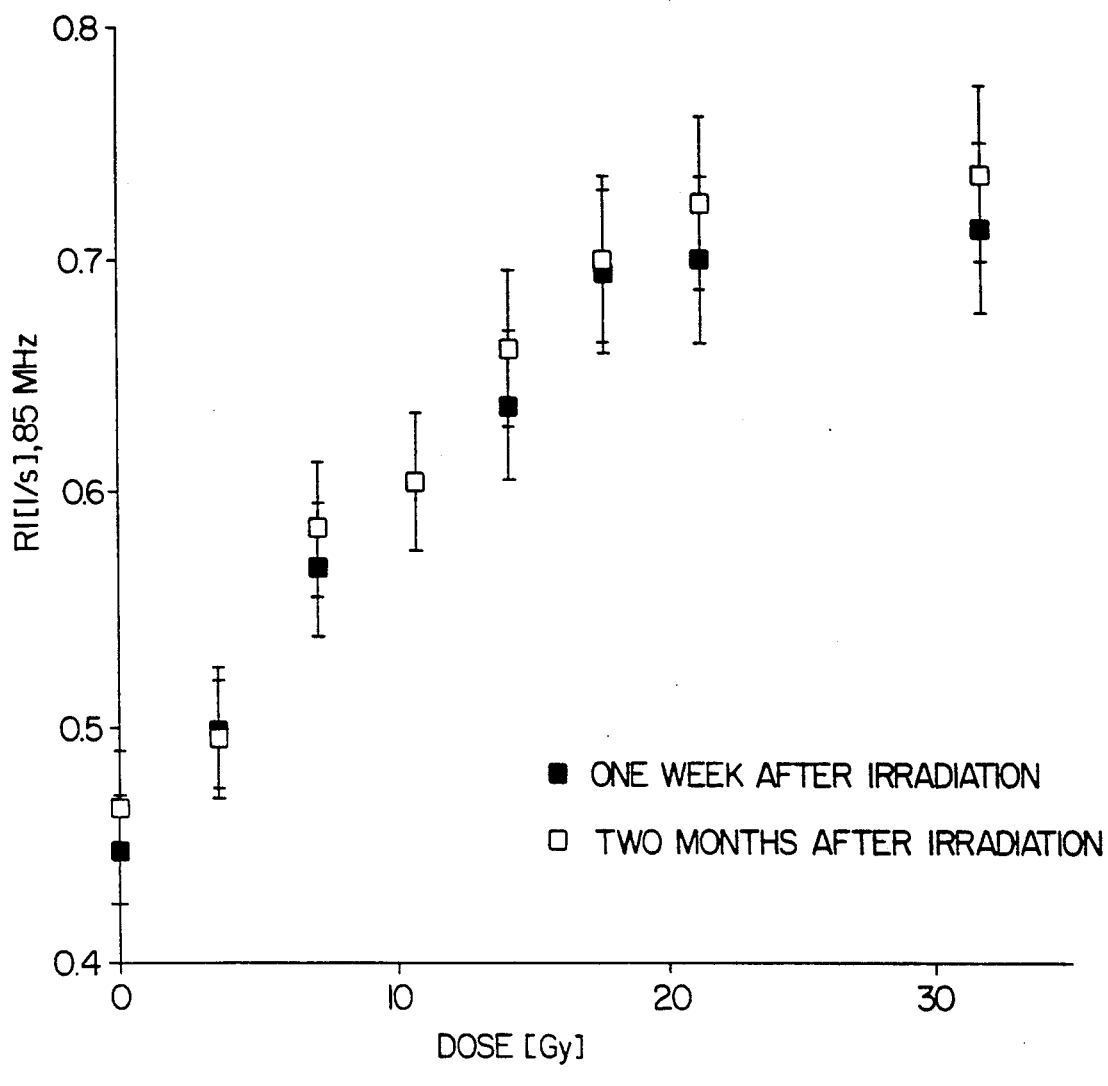
F I G. 4

THREE-DIMENSIONAL DETECTION, DOSIMETRY AND IMAGING OF AN ENERGY FIELD BY FORMATION OF A POLYMER IN A GEL

This invention was made with government support under grant numbers NCI T32 CA09549, 1R01 CA40675 and 1R01 CA44605 awarded by the Department of Health and Human Services. The government has certain rights in the invention.

BACKGROUND OF THE INVENTION

This invention relates to a method of forming a radiant energy-generated, permanent three-dimensional polymeric image in a gel and to an article of manufacture comprising a gel adapted for use as a dosimeter, e.g., of ionizing radiation.

There are numerous applications for a dosimetric technique that can accurately measure radiation dose distributions in three dimensions with high spatial resolution. For example, in radiation therapy there are several treatment regimes for which it would be valuable to characterize the distribution of radiation with millimeter resolution in tissue-equivalent, homogeneous and heterogeneous media. Towards this end, the use of aqueous gels containing Fricke dosimeter solution in combination with magnetic resonance imaging (MRI) techniques was suggested. See Gore, J. C., et al., Phys. Med. Biol. 29:1189–1197; 1984; (Abstract. Res. Imaging 2:244; 1984.

It was shown that the radiation-induced oxidation of ferrous ions to ferric in solution could be detected by a change in the water proton spin relaxation times, T1 and T2, and the changes were large enough to be mapped with high spatial resolution by magnetic resonance imaging (MRI) when the Fricke solution was dispersed in a gelatin or agarose gel. Gore, J. C., et al., Mag. Res. Imaging, supra; Schulz, R. J., et al., Phys. Med. Biol. 35:1611–1622; 1990.

The conversion of ferrous to ferric ions promotes proton relaxation because the ferric ions produce stronger paramagnetic dipole-dipole interactions with the water protons. Also, the water relaxation rates are proportional to radiation dose over a wide range of doses. This work promoted several groups to investigate this approach to radiation dosimetry. Day, J. J. Phys. Med. 35:1605–1609; 1990; Olsson, L. E., Ph.D. Thesis, Lund University, Malmo, Sweden, 1991.

Their results verify the potential value of such an imaging technique. For example, the practical value and unique ability of this technique to map the dose distributions of the complex irradiations used in stereotactic radiosurgery have recently been demonstrated. Olsson, L. E., supra; Schultz, R. J., et al., "Assessment of the accuracy of stereotactic radiosurgery using Fricke-infused gels and MRI." (Unpub., submitted to Med. Phys.) However, there is a major disadvantage that is intrinsic to the Fricke gel medium, viz., ferric ions are able to diffuse quite freely through the gel after irradiation, with a point spread function whose width is about 2 mm after one hour. Schulz et al., supra; Olsson, L. E., supra. This leads to a gradual blurring of the radiation dose pattern and a consequent loss of spatial resolution, and places constraints on the minimum dose rate that can be applied, on the time between irradiation and imaging, and on a number of images that can be recorded before diffusion introduces errors in the subsequent calculation of relaxation times. There are ways to correct for this diffusion but the complexities of this approach present a major limitation to the practicality of the technique. A gel in which diffusion of the radiation-induced, NMR-sensitive species is insignificant over relatively long periods of time would be highly advantageous, especially when weak radioactive brachytherapy sources are to be studied.

Other dosimetry systems employing gels or polymerizable resins are described in the patent literature.

U.S. Pat. No. 4,430,258 discloses a method of producing liquid equivalent solid gamma ray calibration standards comprising the steps of adding a first organic solvent to a calibrated aqueous solution of radioactive material, either in the form of a single isotope or mixed isotopes, to form a first solution; mixing the first solution with a polymerizable resin dissolved in a second organic solvent together with a hardening catalyst to form a second solution; and curing the second solution. With isotope standards requiring highly acidic conditions, a stabilizing agent is added to the first solvent to complex with metal and hydrogen ions so as to prevent plate-out.

U.S. Pat. No. 4,588,698 discloses microencapsulation of solid phase scintillators in gels selectively permeable to diffusible radioactive label. These encapsulated scintillators are used to monitor the concentration of radioactive-tagged substances in fluid systems.

U.S 4,350,607 discloses a radiation detector and dosimeter which is based on the fact that a sufficiently finely-dispersed liquid suspended in a host liquid of high viscosity or gel is stable at temperatures above its normal boiling point for long periods of times provided it is protected from contact with walls, or other types of initiators which can cause volatilization or vaporization of the droplets. Radiation, and particularly neutron radiation of sufficient energy and intensity on coming in contact with such droplets can trigger volatilization. The volume of vapor evolved then serves as a measure of radiation intensity and dosage.

U.S. Pat. No. 4,779,000 discloses a direct reading, self-powered detector and dosimeter for gamma rays, and other low LET radiation, and optionally microwaves in which a transparent elastic solid medium contains uniformly dispersed droplets of a very high vapor pressure detector liquid substantially immiscible with the elastic solid. It has been found possible to form stable droplets having a sufficiently high degree of superheat for their vaporization to be sensitive to lightly ionizing radiation such as gamma rays and even to microwave radiation. The solid medium will retain a record of each droplet vaporized, the number being proportional to the dose of radiation. If desired, the detector liquid vapors can be condensed or compressed into droplets again and the detector/dosimeter re-used.

U.S. Pat. No. 4,946,705 discloses a device for measuring gaseous substances which comprises a reflectant backing which is disposed a layer which is composed of microparticles coated with a reagent and then with a diffusion layer which contains a diffusion moderator, viz., a film forming high molecular weight material and binder, and optionally a plasticizer.

U.S. Pat. No. 3,616,369 discloses a method for controlling the molecular weight of a polymer derived from an ethylenically unsaturated monomer which can be catalyzed to polymerize by a Lewis acid, which comprises mixing said monomer with a Lewis base soluble in the monomer, and then reacting the mixture with an amount of high-energy radiation at least sufficient to initiate and propagate polymerization of the monomer, the Lewis base being selected from the class which functions to determine the molecular weight of the polymer produced at a given radiation dosage and temperature; the monomer being selected from ethylenically unsaturated monomers having electron-releasing groups attached directly or indirectly to the ethylenic linkage of the monomer which impart a Lewis base character to said monomer.

The invention is said to be also applicable to controlling the molecular weight of a polymer derived from a monomer which can be catalyzed by a Lewis base by mixing the monomer with a Lewis acid and then irradiating the mixture at a given temperature and to a given radiation dosage.

The following patents relate to a process of building a three-dimensional object by adding layer upon layer (laminations) using some form of energy beam (light, ionizing radiation, etc.) controlled by a computer program on a polymerizing medium: 5,130,065; 5,123,734; 5,104,592; 5,096,530; 5,076,974; 5,059,359; 5,059,021; 5,058,988; 5,015,424; 4,999,143; 4,996,010; 4,929,402; and 4,575,330.

OBJECTS OF THE INVENTION

An object of the invention is to provide a gel system which is suitable for three-dimensional imaging of an energy field, which image is stable even several weeks after irradiation.

Another object is to provide a novel method for producing a radiant energy-generated visible and/or MRI visualizable permanent image in a gel.

Still another object is to provide an article of manufacture adapted for use in radiation dosimetry.

A further object is to provide an article of manufacture comprising a dimensionally stable gel which has formed therein a visible and/or MRI visualizable image of the distribution of an accumulated dose of radiant energy absorbed by the gel.

Upon further study of the specification and appended claims, further objects and advantages of this invention will become apparent to those skilled in the art.

SUMMARY OF THE INVENTION

In a method aspect, this invention relates to a method of detecting, measuring and displaying a non-uniform field of radiant energy by forming a visible and/or MRI visualizable permanent three-dimensional image in the gel, which image is representative of the distribution of a dose of the field of energy to which the gel is exposed, which comprises exposing a dimensionally stable gel which contains uniformly dispersed therein in storage stable form at least one monomer which is polymerizable in the gel by the radiant energy, in a concentration effective when thus polymerized to produce a polymer in the gel which alters the relaxation time of the solvent phase of the gel in any area thereof in which the polymer is formed, to a non-homogeneous dose of radiant energy until a permanent image formed by the polymer which is representative of the dose of radiant energy received by the gel is formed therein. In a preferred aspect, the gel contains both a linearly polymerizable monomer, e.g., a vinyl monomer, and a cross-linkably polymerizable comonomer, e.g., a monomer with two vinyl groups.

In another aspect, this invention relates to an article of manufacture comprising a gel which is adapted for use as a radiation dosimeter for the detecting, measuring and displaying the absorption of the radiant energy by forming a visible and/or MRI visualizable permanent three-dimensional image therein which is representative of the distribution of the dose of radiant energy to which the gel is exposed, which comprises a gel which is maintained in a dimensionally stable shape and which contains uniformly dispersed therein in storage stable form a radiant energy polymerizable monomer or mixture of monomers, in a concentration effective when thus polymerized to produce a polymer in the gel which alters the relaxation time of the solvent phase of the gel in any area thereof in which the polymer is formed. In a preferred aspect, the gel contains (a) a linearly polymerizable monomer and (b) a cross-linkably polymerizable comonomer.

In yet another aspect, this invention relates to an article of manufacture as defined herein bearing therein a permanent image which is visible and/or MRI visualizable and which is formed from a cross-linked polymer which is insoluble in the gel and produced therein by radiant energy initiated polymerization of one or more monomers in the gel, which image is representative of the distribution of the radiant energy to which the gel has been exposed.

BRIEF DESCRIPTION OF THE DRAWINGS

Various other objects, features and attendant advantages of the present invention will be more fully appreciated as the same becomes better understood when considered in conjunction with the accompanying drawings, in which like reference characters designate the same or similar parts throughout the several views, and wherein:

FIG. 1 are dose-response (proton NMR longitudinal relaxation rate, $R_1$, versus radiation close in Grays) curves for an 8% BANANA (N,N'-methylene-bis-acrylamide/acrylamide/nitrous oxide/agarose) gel and an (●) and 8% T monomer solution (○), obtained at 20 MHz;

FIG. 4 are dose-response ($R_1$) curves for the same set of BANANA gel samples, obtained at 85 MHz, 5 days (■) and 50 days (□) post-irradiation.

DETAILED DISCLOSURE

Figure 2:
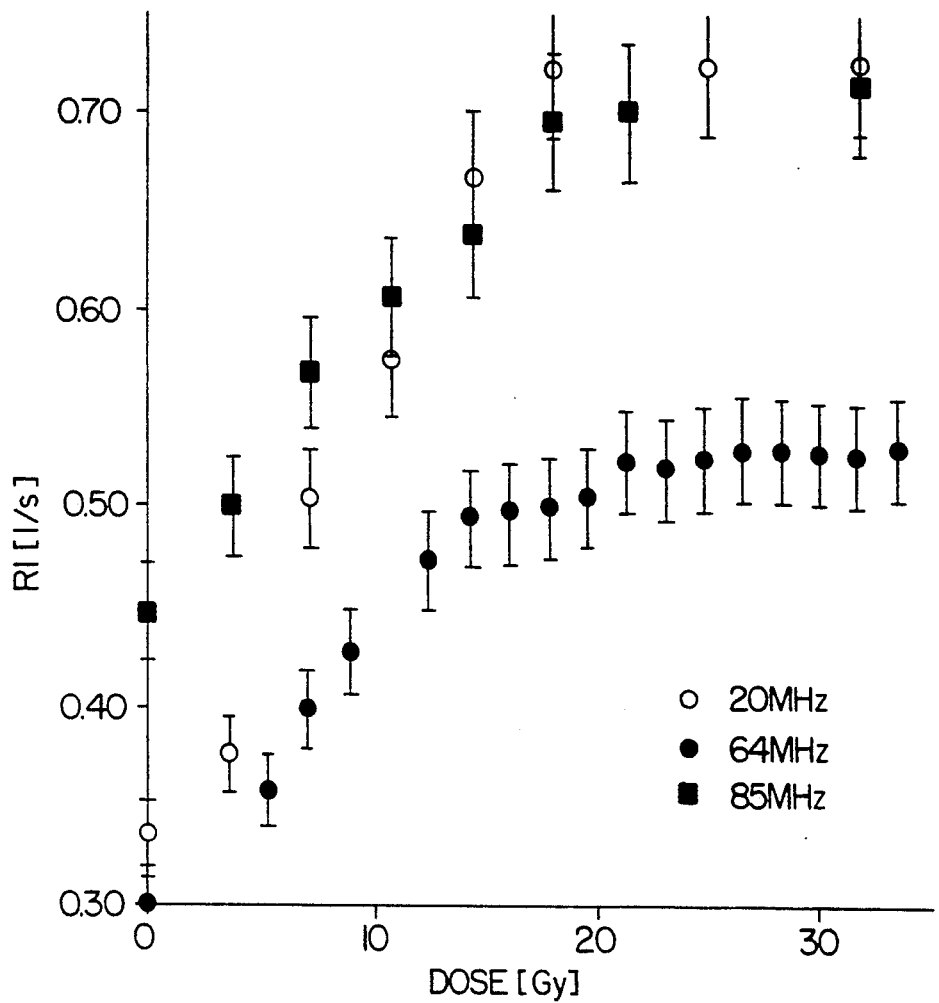
FIG. 2 are dose-response curves for the BANANA gel obtained at 20 MHz (○), 64 MhZ (●), and 85 MHz (■)

The present invention is a new method for the three-dimensional detection, measurement and display of free radical, ionic or excited state intermediates, whether generated by radiant energy, e.g., ionizing radiation or light, e.g., ultraviolet or visible light, or equivalently by mechanical, e.g., ultrasonic cavitation, or chemical means, which are capable of initiating the formation and precipitation from a dimensionally stable, tissue-equivalent gel of a polymer structure whose interface with the solvent phase of the gel facilitates the NMR relaxation of the nuclei of the solvent. This polymeric structure can be created by the co-polymerization of a mixture of a homopolymerizable monomer and a cross-linking comonomer in the gel. However, the former may, in some instances at least, not be required, e.g., if the cross-linking monomer forms an insoluble polymer by itself or with the resin or polymeric material forming the gel. The gel matrix, which serves to limit the spread of the polymerization, preserves the shape of an image created in the gel by the copolymerization of the monomer and cross-linking comonomer therein and prevents convection of the solvent monomers as well as diffusion of the cross-linked polymer in the gel. Polymerization and cross-linking, in which processes the gel matrix may also participate, serve to amplify the initial reaction of those intermediates. Changes in the molecular structure and dynamics of the cross-linked polymer influence the local NMR relaxation behavior of the solvent protons, or atoms sharing a nuclear magnetic moment. Due to the high concentration of the cross-linking monomer relative to the linearly polymerizable monomer, intrinsically short polymer chains are obtained. Therefore, the resultant overall polymeric structure reflects faithfully the spatial distribution of the density of the intermediates integrated over the time of exposure to the radiant energy and is not dependent, within limits, on the rate at which the intermediates are generated. As the high density of cross-linking results also in the precipitation of the polymer from the liquid phase, light scattering increases with conversion. After the polymerization is complete, which may take from minutes to days, depending on the choice of the monomers, the gel matrix and the solvent, the polymer is stable enough to allow a thorough examination by MRI, optical or other non-invasive means.

The gel employed in this invention does not depend upon the relaxation induced by paramagnetic ions but instead takes advantage of two phenomena, viz., (1) polymerization of a monomer or mixture of monomers initiated by an energy field to produce a polymer and (2) alterations in the gel solvent proton NMR relaxation resulting from the presence therein of the polymer.

The solvent employed to form the gel is preferably water. However, other solvent systems which (a) are rich in protons, (b) which will form a gel when mixed with a gel-forming resin or polymer, and (c) which will dissolve or disperse the monomer and comonomer employed to produce the radiant energy-generated image in the gel, can be employed. Examples of suitable other solvent systems are monohydric, dihydric, and trihydric alcohols, alone or mixed with water; tetrahydrofuran/$H_2O$; and non-aqueous solvents which meet the foregoing criteria, e.g., ethylene glycol and propylene glycol, polyethylene glycols and glycerol.

A contemplated equivalent of this invention which is otherwise the same employs a solvent for the gel which has an atom other than hydrogen having a nuclear magnetic moment, e.g., $^{19}F$, $^{31}P$ and $^{13}C$. (See Akitt, N. W., "NMR and Chemistry", Chapman & Hall Pub. 1973, pp. 5, et. seq.)

The resin or polymer used to produce the gel can be any of a wide variety of naturally occurring gums, including polypeptides and polysaccharides, e.g., agarose, gelatin, karaya gum, kappa carrageenan and starch, and synthetic polymers, e.g., a solution of in situ radiation cross-linked linear water soluble polyethylene oxide having a weight average molecular weight from about 0.02-6.10$^6$ Daltons, as described in U.S. Pat. No. 3,928,215 and European Pat. Pub. No. 0101376, an acrylic polymer as disclosed in U.S. Pat. No. 3,911,906, hydroxypropylcellulose, and a hydrophilic material as disclosed in U.S. Pat. No. 3,822,238, 4,156,066 and 4,156,067.

The amount of resin or polymer employed depends on its ability to form a gel which is rigid enough to immobilize the cross-linked polymer produced from the monomer and comonomer therein. Generally, an amount which forms a rigid gel is preferred. For example, about 1% agarose and about 5% gelatin form rigid gels, i.e., gels which do not flow under the force of gravity.

Any monomer which is polymerizable by the radiant energy source can be used to produce the polymer which forms the permanent image in the gel can be employed. A preferred class of monomers suitable for carrying out this invention is a mixture of a monomer having a single polymerizable moiety in the molecule, i.e., which is capable of forming linear homopolymers, and a cross-linkable polymerizable comonomer.

A radiation-induced cationic polymerization can employ monomers which have electron-rich sites, i.e., which have an electron-releasing group attached directly or linked indirectly to the carbon atoms of the ethylenic bond. Among some of the more common electronic releasing groups which can be used to promote a radiation-induced cationic reaction are: $CH_3$, $C_6H_5$, $-OCH_3$, $-OC_2H_3$, $-OC_6H_3$, $CH_3OC_6H_4$, $CH_2=CH$, $-(CH_2)_2CHO$, $-(CH_3)_3CHCH_3O-$ and $RCH_3C=CH-CH_2=CHR$, wherein R is alpha or beta naphthyl or anthracyl. In general, the ortho-para directing substituents in benzene rings, when attached directly or indirectly to the carbon atoms of the ethylenic double bond, will impart a Lewis base character to the ethylenic structure.

Typical monomers known to be polymerized by way of $CH=C(OR)_2$ cationic polymerization process in that such monomers are initiated to polymerize by Lewis acids or Friedel Crafts and which therefore are useful in the method of this invention are isobutylene, alkyl vinyl ethers ($CH_2=CHOR$ where R is a straight or branched chain having up to 18 carbon atoms), such as isopropyl vinyl ether, and isobutyl vinyl ether and octadecyl vinyl ether, styrene, butyl vinyl ether, p-methoxy styrene, p-dimethylamino styrene, alpha-substituted styrenes, such as alpha methyl styrene, beta pinene, 1,3-butadiene, n-vinyl carbazole, vinylidene ethers, $CH=C(OR)_2$ wherein $R = CH_3$, $C_2H_5$, n-$C_3H_7$, iso-$C_3H_7$, vinyl naphthalenes, vinyl pyridines, 2-vinyl dibenzylfuran, cyclopentadiene, terpenes, myrcene and unsaturated hydrocarbons derived from cracking petroleum wherein each of the monomers have electron-releasing substituents which render the ethylenic group electronegative or basic in the Lewis base sense. Polymerizable monomers having a 1,2- or alpha-beta-substituted structure will also proceed by a radiation induced cationic polymerization. Among such monomers are those with an indene, acenaphthylene, coumarone structure; 1,1diphenylethylene, 1,2-dimethoxyethylene and anethole.

Other examples of radiant energy polymerizable monomers are the vinyl compounds containing an activating substituent, such as the acrylics, e.g., acrylic acid, acrylamide and acrylonitrile, maleic anhydride, the alkyl acrylates, e.g., methyl acrylate and (meth)acrylate, vinyl alcohol and the vinyl esters, e.g., vinyl acetate; vinyl halides, e.g., chloride and vinylidene chloride. The choice of monomer or mixture of monomers will depend, in part, on its or their solubility or dispersibility in the selected gel.

As would be apparent, the selection of the specific monomer to be employed depends not only on the solvent employed to form the gel (the monomer must be dispersible or soluble therein, stable therein and polymerizable therein under the influence of the radiant energy to which the gel is exposed) but also on the nature of the radiant energy.

The cross-linkably polymerizable comonomer present in the gel, like the linearly homopolymerizable monomer, is one whose polymerizable moiety is polymerizable by the type of radiant energy which will be employed to create the permanent image in the gel. It is distinguished from the monomer therein by being a cross-linking monomer, i.e., it possesses two or more polymerizable moieties in the molecule. Examples of such comonomers are bis-hydroxy esters and bis-amides of acrylic acid, e.g., dihydroxyethylene-bis-acrylamide. Like the linearly homopolymerizable monomer, the choice thereof is dependent in part on its solubility or dispersibility in the gel employed.

The concentration of the monomer or mixture of monomers in the gel is that which, either alone or in conjunction with the resin or polymer forming the gel, will produce a permanent image in the gel, e.g., from about 1 to about 10 wt. %. The optimum concentrations are dependent on the selected comonomer and its concentration in the gel and, to a lesser extent, the composition of the gel.

The weight ratio of monomer to comonomer in the gel generally is from about 1:1 to about 10:1.

The gel is immobilized in a suitable container which is substantially transparent to the radiant energy employed to copolymerize the monomer and comonomer in the gel, e.g., glass, quartz, or clear plastic, e.g., polyacrylic, with dimensions large enough to hold in an undistorted position the 3-D image generated in the gel contained therein. Because atmospheric oxygen interferes with the formation of the copolymer, the container is fitted with a sealing means which renders it airtight after the gel is placed therein.

As stated above, only a single monomer is required if it is polymerizable to an insoluble polymer either by homopolymerization or reaction with the resin of polymeric material forming the gel and its polymerization or reaction with the resin of polymeric material forming the gel and its polymerization is self-limiting, i.e., does not continue beyond the area of the gel which receives the dose of radiant energy.

A contemplated equivalent of this invention employs a monomer and comonomer-containing gel of this invention in sheet form, e.g., sealed between an opaque moisture impermeable polymer backing sheet and a moisture impermeable clear facing PVC or polyvinylidene chloride film and sealed until used in a gas impermeable envelope, e.g., a mylar film-aluminum foil laminate, to form a permanent 2-D image in the gel which correspond to a cross-sectional section of the 3-D images produced according to this invention. Such 2-D images, like the 3-D images of this invention, have the advantage of being both stable and developable in normal lighting and are useful, e.g., in sectional analysis of radiation patterns both in the medical diagnostic and in commercial construction environments, e.g., to reveal structural flaws. Another contemplated equivalent employs another source of energy, e.g., chemical or physical (cavitation) as the polymerization initiator.

Because of the strong effect which dissolved gases have upon the formation of the copolymer, the container in which the gel is held must be capable of preserving a prescribed gaseous atmosphere therein, e.g., it may be purged with an oxygen-free gas such as dry nitrogen or nitrous oxide and/or with a chemical oxygen scavenger, before and/or after the addition of the monomer and comonomer to the gel.

The monomer and comonomer are preferably added to the gel while the gel is in a fluid state, e.g., by heating above its gelling temperature. After the addition, the gel is then brought to a solid or semi-solid state, e.g., by cooling.

The radiant energy employed to induce polymerization of the monomer or mixture of monomers can range from visible and U.V. photons and sound induced cavitation (mechanical energy) to ionizing radiation, e.g., X-rays or gamma rays, electrons, protons, neutrons, or heavy charged particles from any electrical source or radioactive substance source. Ionizing radiation is the preferred form of the polymerization-inducing radiant energy, with X-rays and gamma rays being the most commonly employed.

The dose of radiant energy to which the gel is exposed depends in part on the intended purpose of the radiant energy. For example, if the radiant energy is X-rays or gamma rays intended for medical therapy or diagnosis, the dose will be that which is appropriate for that end use. In other words, a gel system will be selected which will produce a permanent image in the gel at that end-use dose. Conversely, if the dose is not dictated by the end use, e.g., the detection of flaws in articles of manufacture, the dose may be tailor-made to the gel, i.e., to the amount required to produce a permanent image in the gel.

In carrying out the process of this invention, a monomer of the defined class and the selected comonomer is mixed with the gel while the latter is in a fluid state and the gel is then hardened in a conventional manner, e.g., by cooling, and the resultant mixture of monomers and gel is exposed to at least sufficient radiant energy, e.g., ionizing radiation as measured in joules per kilogram (or gray) of dosimeter, to initiate and propagate polymerization. The determination of the amount of absorbed energy necessary to induce a definite amount of polymerization of a given monomer and comonomer of the defined class is a matter of routine skill within the art and varies with the monomer and comonomer. Further amounts of radiant energy results in an increased degree of conversion, i.e., it will increase the amount of monomer converted to a given cross-linked polymer, the alteration of the NMR relaxation rate of solvent nuclei by the resultant polymer and the optical opacity created by the polymer in the gel.

Although the novel article of manufacture described herein is called a dosimeter, it will be obvious to those skilled in the art that the visual image created in the gel can be used in other fields, e.g., the visual arts and design.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosures of all applications, patents and publications, cited above and below, are hereby incorporated by reference.

EXAMPLES

Methods and Materials

In general, the preparation of the acrylamide and N,N'-methylene-bis-acrylamide comonomer-containing gel is as follows: The monomer and "bis" comonomer are dissolved in water in equal amounts by weight (referred to in biochemical literature as the 50% C composition, wherein % C=100%×(mass of crosslinker)/(total mass of comonomers)), together with 1% by weight agarose above its gelling temperature. The solution is subsequently saturated with nitrous oxide gas by bubbling the gas through it to remove gaseous oxygen, which inhibits the polymerization. (Bio-Rad bulletin 1156: acrylamide polymerization—a practical approach; Bio-Rad Laboratories, 1987.) The nitrous oxide-saturated solution is then allowed to gel at room temperature after an airtight cover has been applied. (Nitrous oxide was chosen in this study mainly because of its high solubility in water.) The acronym BA-NANA, whose letters stand for Bis, Acrylamide, Nitrous oxide ANd Agarose, is used hereinafter to describe the resultant gels.

In these examples, an ultrapure molecular biology grade acrylamide and Nu-Sieve ® GTG Agarose (gelling temperature 35° C.), both produced by American Bioanalytical, and an electrophoresis purity Bis from Bio-Rad Laboratories, were used. In all preparations, a technical grade $N_2O$ was used. The water was triply distilled and deionized.

Two types of image-generating experiments were performed. The first type demonstrated that spatial dose distributions in large volumes of the BANANA gels can be represented using MR imaging and that the results are stable over time. In the second type, the dose response of the gels in small volumes at different NMR frequencies was quantified.

For the NMR imaging study of irradiation effects, the content of the total comonomer was 5% by weight (referred to as 5%T composition) and 1 mM sulphuric acid (Baker Analyzed Products) were dissolved in the agarose solution before the comonomers were added, so as to obtain pH=3. (These experiments on gels at acid pH were guided by previous studies of relaxation in polyacrylamide, although a neutral pH has subsequently been shown to produce a much better reproducibility of the dose-response). The gel was formed in a Lucite cylinder, 14 cm in diameter and 20 cm high, with caps which rendered it air tight.

The gels made to assess the dose-response at neutral pH contained 8% by weight of the total monomer. The solutions showed pH=6 prior to gelation, as measured by the color pHast ® dye paper indicator made by EM Science. In order to examine the role of agarose in the radiation-induced polymerization process a control 8% total comonomer, $N_2O$-saturated aqueous solution was also prepared.

The gel in the Lucite cylinder was irradiated through the bottom with a 6 MV X-ray square beam aimed vertically upwards. The dose and the dose rate at $d_{max}$ were 20 Gy and 6.7 cGy s$^{-1}$ respectively. In the dose-response experiments, the irradiations were made using 250 kV X-rays of half value layer=3.0 mm Cu and dose rate 5.8 cGy s$^{-1}$. The doses ranged from 0 to 34 Gy. Samples were irradiated in glass test tubes, 9 mm in diameter and 10 cm long.

There was a three to five day period between the irradiation and NMR measurements, during which time all the samples were stored at room temperature and away from daylight. The large irradiated gel was imaged once a week for three consecutive weeks in a 1.5 T GE Signa scanner, using a spoiled gradient echo (SPGR) pulse sequence with 90° flip angle, TR of 100 ms and TE of 5 ms to obtain a heavily T1-weighted image.

NMR relaxation measurements were performed at three NMR frequencies: 20, 64 and 85 MHz. At 20 MHz, and IBM "Minispec" pulsed spectrometer was used. T1 was measured by inversion recovery using 8 values for the pulse delays and a three parameter non-linear least squares fit to the data. T2 was measured by a CPMG sequence with every 8th echo sampled, using 20 or more data points so that the signal decayed by at least a factor of three. The time delay between consecutive 180° pulses was 100 $\mu$s. The temperature of the samples was kept constant at 40° C. when the "Minispec" was used.

At 64 MHz, the measurements were made from multiple images obtained from a 1.5 T GE Signa scanner. Coronal slices 5 mm thick were acquired across the lower ends of the test tubes in a rack, and the identical scan followed through the nonirradiated controls. Saturation recovery was used for the T1 computations, with a train of the following TR values: 6000, 4000, 2000, 1000, 600, 400, and 200 ms. A CPMG multi-echo sequence was used to determine T2, with TE values of 30, 60, 90, and 120 ms, and a TR of 6000 ms. Relaxation times were calculated in regions of interest using GE Signa Image Analysis software.

Relaxation times at 85 MHz were determined using a 2.0 T GE CSI spectrometer. Inversion recovery was employed for T1 and a Hahn spin echo for T2. T1 of the gel samples at 85 MHz was also measured two months after the first measurement.

Results

For the gel in the "Lucite" cylinder irradiated by 6 MV X-rays, the region altered in T1 relaxation of the MR image corresponds closely with an opalescent white volume apparent visually. No significant spread of the irradiated region was apparent or detected either in MR images or visually.

FIG. 1 shows the relaxation rate 1/T1 measured at 20 Mhz as a function of dose, for the 8% aqueous solution of 50% C comonomers in the absence and presence of agarose. It is evident that the presence of agarose makes the gel respond to radiation gradually, in contrast to the solution of the comonomers. The latter does not show any change in T1 until a threshold dose of about 15 Gy is reached, above which there is a flat plateau on the dose-response curve.

Figure 3:
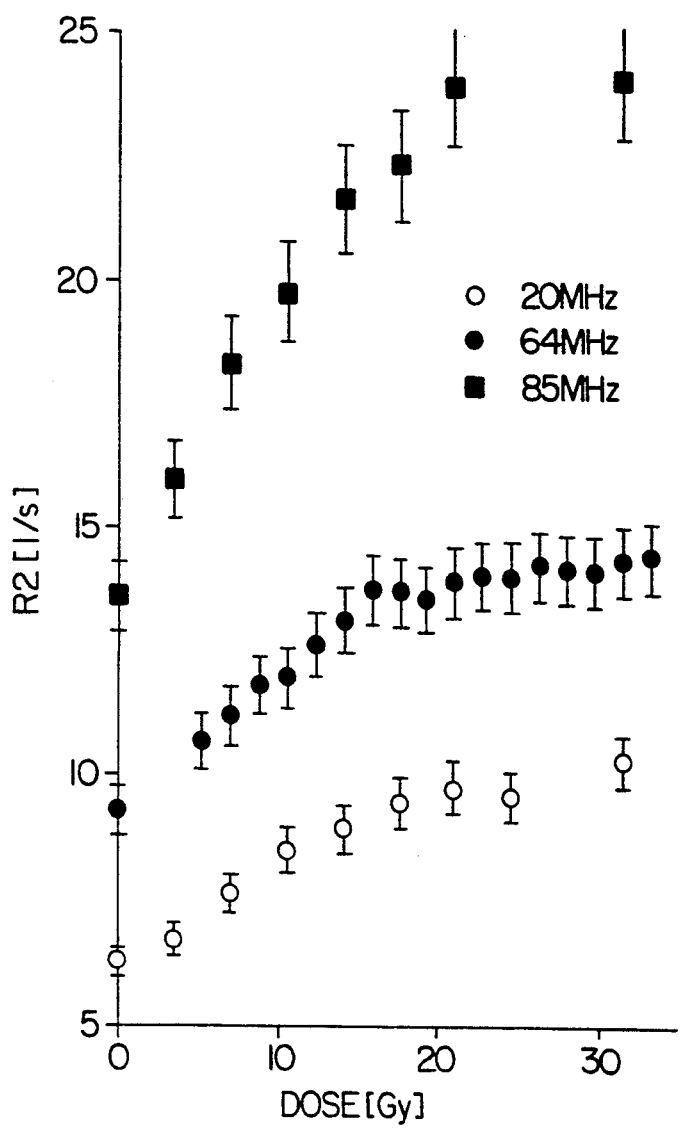
FIG. 3 are dose-response curves (proton NMR transverse relaxation rate, $R_2$, versus radiation dose in Grays) for the ,BANANA gel obtained at 20 MHz (○), 64 MHz (●), and 85 Mhz (■)

FIGS. 2 and 3 show that both 1/T1 and 1/T2 increase linearly in the gels up to a dose of about 15 Gy and level off at about 20 Gy. Th emaximum dose of the linear response in the gel corresponds to the threshold dose in the solution (FIG. 2).

As evidenced by the data in Table 1 below, the slope of the dose-response curve decreases with increasing NMR frequency when measured by 1/T1. In contrast to this, the slope of 1/T2 vs. dose increases with the frequency. Both the absolute values of 1/T2 and their increments per 1 Gy of absorbed dose are an order of magnitude greater than the corresponding values of 1/T1.

FIG. 4 shows the radiation-induced changes in the gels are very stable. The measured values of 1/T1 at 85 MHz did not change by more than 5% over the period of two months of storage at room temperature.

At a dose of about 5 Gy the gels become visibly cloudy. The optical turbidity increases with dose to become solid white at the saturation dose.

Within a week after preparation, isolated crystals were observed to have formed at several spots in non-irradiated regions of the 8% T gels. When the concentration of the total comonomer was lowered to 6%, these isolated crystals did not form.

TABLE 1

| Slopes of dose-response curves in the low dose region for BANANA gels | | |
|---|---|---|
| v[MHz] | $\Delta R_1/\Delta D[s^{-1}Gy^{-1}]$ | $\Delta R_2/\Delta D[s^{-1}Gy^{-1}]$ |
| 20 | 0.024 | 0.22 |
| 64 | 0.015 | 0.28 |
| 85 | 0.014 | 0.67 |

Discussion

The radiation-induced changes in the NMR characteristics of the BANANA gel are probably the result of two well-documented effects. First, free radical products of water radiolysis initiate the polymerization of vinyl compounds in de-aerated aqueous solutions. Chambers, K. W., et al., Trans. Faraday Soc. 63:1699–1711; 1967. Second, proton relaxation rates increase as a result of polymerization or cross-linking in various hydrophilic polymers. Katayama, S., et al., J. Am. Chem. Soc. 101:4485–4488; 1979; Gore, J. C., et al., Magn. Res. Med. 9:325–332; 1989.

In the BANANA gel the degree of polymerization and cross-linking of monomers dissolved in the liquid phase of a gel increases in proportion to the radiation dose and, as a result, the proton relaxation rates correspondingly increase. Also, as the resultant polymers are relatively immobile within the gel matrix, their distribution in the gel remain unchanged over long periods of time.

Acrylamide-bis copolymer and agarose make a gel that is easy to produce and exhibits the desired properties. Agarose/acrylamide composite gels, prepared with suitable chemical initiators and buffers, have been used for protein and nucleic acid separations. Peacock, A. C. et al., Biochemistry 7:668–674; 1968.

In order to restrict the polymerization chain propagation so as to keep the radiation-induced changes local, we introduced an unusually high concentration (50% C) of the cross-linker (Bis). This is known to result in the formation and precipitation of insoluble polymeric agglomerates, Gelfi, C., et al., Polymer Electrophoresis 2:213–228; 1981, whose size is comparable to the wavelength of visible light and which causes increased optical turbidity. Due to the formation of these structures, polymerization is confined within the site of initiation and the polymer does not diffuse through the gel pores. It is well established that agarose alone has no significant response to radiation. Day, M. J., et al., Nature 166: 146–147; 1950; Olsson, L. E., et al., Phys. Med. Biol. 34:43–52; 1989. Thus, the major role of the agarose in the BANANA gel is to control the spread of polymerization, which otherwise would propagate in an uncontrolled fashion throughout the volume.

The presence of a nonpolymerized band below the exposed-to-air surface of the large irradiated gel was observed and may indicate the well know inhibiting action of oxygen on the free radical polymerization. Swallow, A. J., Radiation Chemistry. An Introduction, London: Longman; 1973. The lucite cylinder containing the gel was tightly covered after the $N_2O$-dispensing probe had been removed, but there probably was enough air left to inhibit the polymerization reaction close to the surface. $N_2O$ was chosen to expel oxygen because it has high solubility in water. The role, if any, played in the observed effects by its ability to scavenge hydrated electrons produced in aqueous solutions by radiation and to convert them into hydroxyl radicals (Swallow, supra) has not been established.

The poorer reproducibility of the dose-response curves of the low-pH gels may indicate that ionic polymerization plays a significant role, as it is known to be more sensitive to the presence of impurities than the free-radical mechanism. Swallow, supra. The spin-lattice relaxation in regular polyacrylamide gels is pH dependent and apparently an exchangeable amide proton plays an important role in connecting the bulk water phase to the more efficient relaxation sites in the polymer backbone. Zhong et al., supra. However, a more complete characterization of the NMR relaxation processes and, specifically, the role of pH remains to be carried out. The structure of the present gel differs considerably from regular polyacrylamide gels (PAG). The formation of the hydrophobic, highly cross-linked structures probably affects the average correlation times of water molecule rotation, the degree of cross relaxation from the solvent to polymer protons or proton exchange between hydration layers and bulk water. These would certainly be expected to affect water relaxation times. In previous work with hydrogels (Gore et al., 1989, supra), it was demonstrated that a strong correlation exists between the amount and type of cross-linking agent and the proton relaxation rate. In protein gels such as albumin, it has been demonstrated that the water proton relaxation rates are dramatically increased when the protein molecules are cross-linked and this largely reflects the cross relaxation between water and non-exchanging protons in the macromolecules. Mendelson, A. D., et al., Magn. Res. Imaging 9:975–978; 1990.

A high concentration of acrylamide and Bis is preferred for shortening relaxation times (Katayama et al., supra). However, the low solubility of the cross-linking monomer (Bis) is a limiting factor. The experiments to explore the effects of changes in the chemical composition on the dose response are being pursued and will be reported separately.

The above-described experiments demonstrate the feasibility of using radiation-induced polymerization and cross-linking in an aqueous gel to record radiation doses and dose distributions by measuring changes in proton NMR relaxation times.

The BANANA gel has some distinct advantages over other approaches to mapping dose distributions. The lack of post-irradiation diffusion blurring, presumably due either to the lower mobility of the precipitated polymer structures or the grafting of these structures to the gel matrix polymer leads to wider applications of the gel in radiation dosimetry because dose rate and post-irradiation imaging time, which are critical to Fricke-dosimeter based gels, need no longer be considered. The BANANA gel is a prototype of a class of water-polymer systems that can be used for mapping complex dose distributions.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method of detecting, measuring and displaying a non-uniform dose of radiant energy by forming a visible and/or MRI visualizable permanent 3-dimensional image in a gel which is representative of the 3-D distribution of the dose of the radiant energy to which the gel is exposed, which comprises exposing a dimensionally stable gel which contains uniformly dispersed therein in storage stable form at least one monomer which is polymerizable in the gel by the radiant energy, in a concentration effective when thus polymerized to produce a polymer in the gel which alters the relaxation time of the solvent phase of the gel in any area thereof in which the polymer is formed, to a non-uniform dose of radiant energy until a permanent image representative of the dose of radiant energy is formed in the gel.

2. A method according to claim 1, wherein the solvent is water.

3. A method according to claim 1, wherein the source of the radiant energy is ionizing radiation.

4. A method according to claim 3, wherein the ionizing irradiation are X-rays or gamma rays.

5. A method according to claim 3, wherein the source of radiant energy is ultraviolet or visible light.

6. A method according to claim 1, wherein the gel contains (a) a vinyl monomer which is linearly polymerizable by radiant energy and (b) a cross-linkably polymerizable comonomer by radiant energy.

7. A method according to claim 6, wherein the vinyl monomer is acrylamide.

8. A method according to claim 6, wherein the comonomer has two vinyl groups.

9. A method according to claim 6, wherein the comonomer is N,N'-methylene-bis-acrylamide or dihydroxyethylene bis-acrylamide.

10. A method according to claim 1, wherein the gel is contained in a gas-tight container which is transparent to the radiant energy and which renders the gel dimensionally stable.

11. A method according to claim 1, wherein the container is free of a polymerization-inhibiting amount of gaseous oxygen.

12. A method according to claim 1, wherein the weight concentration of the linearly polymerizable monomer in the gel is about 1 to 10% and the cross-linkable weight concentration of the comonomer in the gel is about 1 to 10%.

13. A method according to claim 1, wherein the gel is gelatin in water.

14. A method according to claim 1, wherein the gel is agarose in water.

15. A method according to claim 1, wherein the radiant energy is ionizing radiation, wherein the gel contains acrylamide as a monomer which is linear copolymerizable and N,N'-methylene-bis-acrylamide as a comonomer which is copolymerizable; wherein the weight concentration of the monomer in the gel is about 1 to 10%; wherein the weight concentration of the comonomer in the gel is about 1 to 10%; wherein the gel is agarose or gelatin in water; and wherein the gel is contained in a gas-tight container which is transparent to the radiant energy and which renders the gel dimensionally stable.

16. A method according to claim 15, wherein the ionizing radiation are X-rays or gamma rays.

* * * * *

UNITED STATES PATENT AND TRADEMARK OFFICE
CERTIFICATE OF CORRECTION

PATENT NO.   : 5,321,357
DATED        : June 14, 1994
INVENTOR(S)  : Malek MARYANSKI et al.

It is certified that error appears in the above-indentified patent and that said Letters Patent is hereby corrected as shown below:

Column 1, Line 7-11:

Remove paragraph " This invention was made with goverment support under grant numbers NCI T32 CA09549, 1R01 CA40675 and 1R01 CA44605 awarded by the Department of Health and Human services. The goverment has certain rights in the invention."

Signed and Sealed this

First Day of November, 1994

Attest:

BRUCE LEHMAN

Attesting Officer

Commissioner of Patents and Trademarks